(12) United States Patent
Gilder

(10) Patent No.: US 8,127,562 B2
(45) Date of Patent: Mar. 6, 2012

(54) COVER ASSEMBLY FOR AIR CONDITIONER OPENING

(75) Inventor: Adam Gilder, Carrollton, TX (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 540 days.

(21) Appl. No.: 12/402,264

(22) Filed: Mar. 11, 2009

(65) Prior Publication Data

US 2010/0229584 A1 Sep. 16, 2010

(51) Int. Cl.
*F25D 17/06* (2006.01)
(52) U.S. Cl. ............................ 62/89; 62/259.1
(58) Field of Classification Search ............... 62/67, 89, 62/184, 259.1, 259.2, 256, 428; 454/184, 454/225; 361/695, 696, 697; 165/80.3, 104.34; 29/700

See application file for complete search history.

(56) References Cited

U.S. PATENT DOCUMENTS

| | | | | |
|---|---|---|---|---|
| 4,203,486 A * | 5/1980 | Rubbright et al. | ............ | 165/48.1 |
| 7,170,745 B2 * | 1/2007 | Bash et al. | ................... | 361/695 |
| 7,259,963 B2 * | 8/2007 | Germagian et al. | ............ | 361/695 |
| 7,698,491 B1 * | 4/2010 | King et al. | ................... | 710/306 |
| 7,878,888 B2 * | 2/2011 | Rasmussen et al. | ........... | 454/184 |
| 2003/0150231 A1 * | 8/2003 | Spinazzola et al. | ........... | 62/259.2 |
| 2003/0209023 A1 * | 11/2003 | Spinazzola et al. | ........... | 62/259.2 |
| 2004/0129005 A1 * | 7/2004 | Johnson et al. | ................ | 62/87 |
| 2004/0158348 A1 * | 8/2004 | Foulke et al. | ................ | 700/218 |
| 2004/0217072 A1 * | 11/2004 | Bash et al. | ....................... | 211/26 |
| 2004/0227435 A1 * | 11/2004 | Rasmussen | ................... | 312/236 |
| 2005/0159098 A1 * | 7/2005 | Johnson et al. | ............... | 454/184 |
| 2007/0171610 A1 * | 7/2007 | Lewis | ........................... | 361/691 |

OTHER PUBLICATIONS

SearchDataCenter.com, Internet webpage, "Gartner predicts data center power and cooling crisis," http://searchdatacenter.techtarget.com/news/article/0,289142,sid80_gci1260874,00.html, published Jun. 14, 2007.
Upsite Technologies, Inc., Internet webpage, "KoldLok Raised Floor Grommets," http://upsitetechnologies.com/index.php?option=com_content&task=view&id=4&Itemid=6, accessed Jan. 16, 2009.
Hewlett-Packard Development Company, L.P., "Data center cooling strategies," http://h20000.www2.hp.com/bc/docs/support/SupportManual/c01153741/c01153741.pdf, published Aug. 2007.
42U, Internet webpage, "KoldLok Raised Floor Grommets for your Data Center Floor/Server Room Floor," http://www.42u.com/koldlok.htm, accessed Mar. 11, 2009.
PTS Data Center Solutions, Internet webpage, "Changing Cooling Requirements leave many Data Centers at risk," http://www.ptsdcs.com/data-center-cooling.asp, published Jan. 30, 2003.

* cited by examiner

*Primary Examiner* — Mohammad Ali

(57) ABSTRACT

An apparatus is provided including first and second base members having upper and lower flanges, and a cover. The second based member is configured to be adjustably attached to the first base member to define an opening. The cover is configured to be attached to the first base member and/or the second base member to cover the opening. The upper and lower flanges of the first base member are configured to receive a first edge of a hole of an air conditioner plenum and the upper and lower flanges of the second base member are configured to receive a second edge of the hole of the air conditioner plenum.

21 Claims, 5 Drawing Sheets

COVER ASSEMBLY FOR AIR CONDITIONER OPENING

BACKGROUND INFORMATION

Modern data centers can house large numbers of electronic components that can generate large amounts of heat when in operation. Related to this heat problem is that of power and cooling. While sufficient power needs to be provided to the numerous electronic components, the need to cool them is imperative. These competing engineering issues can effectively constrain the capacity of the data centers. Therefore, there is a need for an approach that provides for efficient cooling of components to enable greater capacity of data center facilities.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DESCRIPTION OF THE PREFERRED EMBODIMENT

A preferred apparatus, method, and system for providing efficient cooling of components in a data center facility are described. In the following description, for the purposes of explanation, numerous specific details are set forth in order to provide a thorough understanding of the preferred embodiments of the invention. It is apparent, however, that the preferred embodiments may be practiced without these specific details or with an equivalent arrangement. In other instances, well-known structures and devices are shown in block diagram form in order to avoid unnecessarily obscuring the preferred embodiments of the invention.

Although various exemplary embodiments are described with respect to a data center facility, it is contemplated that these embodiments have applicability to any opening in an air conditioning system through which components extend.

Figure 1:
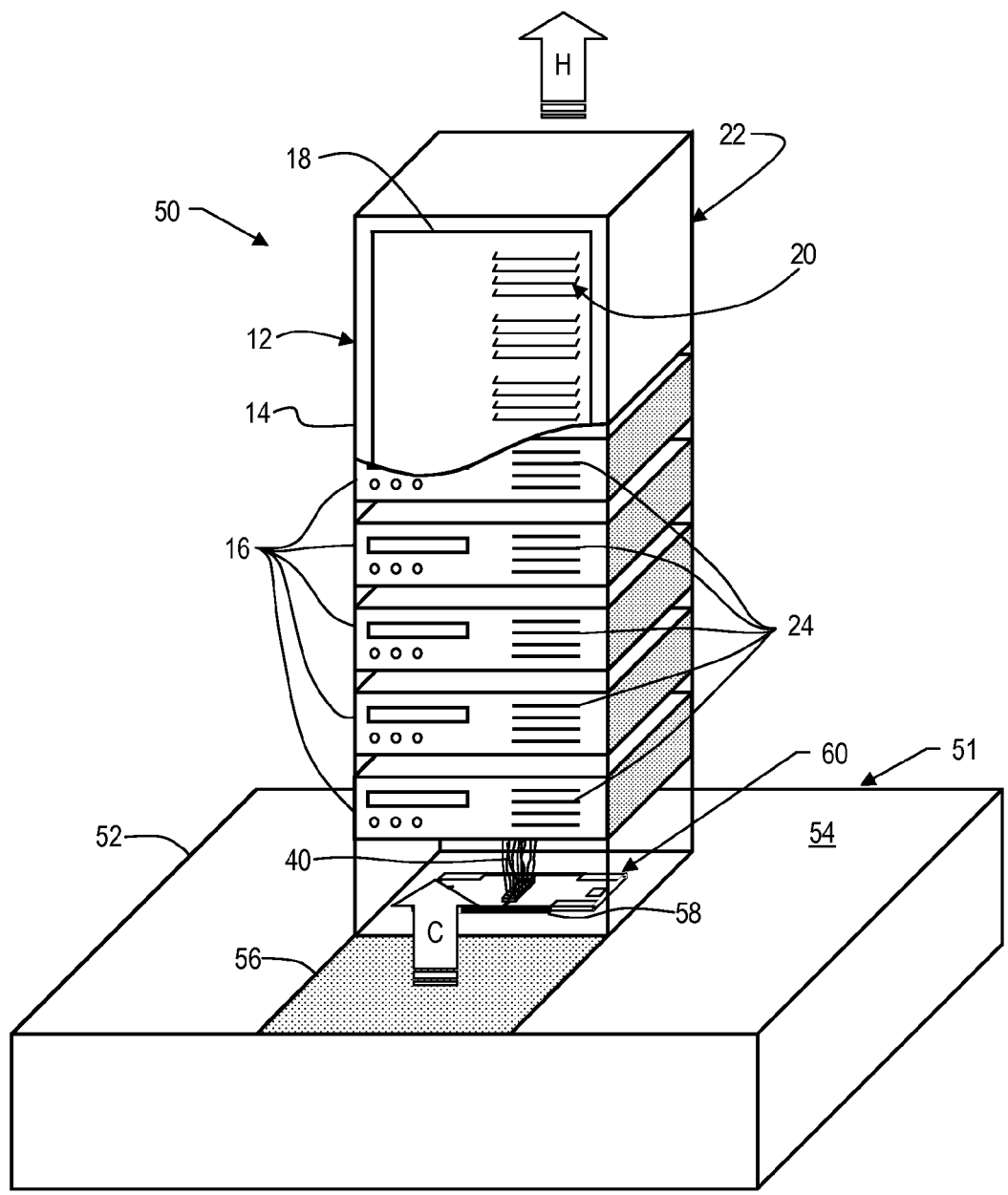
FIG. 1 is a perspective view of a cover assembly for a cable egress opening of an air conditioning system for a data center, according to an exemplary embodiment.

FIG. 1 is a perspective view of a cover assembly for a cable egress opening of an air conditioning system for a data center, according to an exemplary embodiment. To better appreciate the advantages of certain embodiment, it is instructive to examine an exemplary cabinet configuration, shown in FIG. 3.

Figure 3:
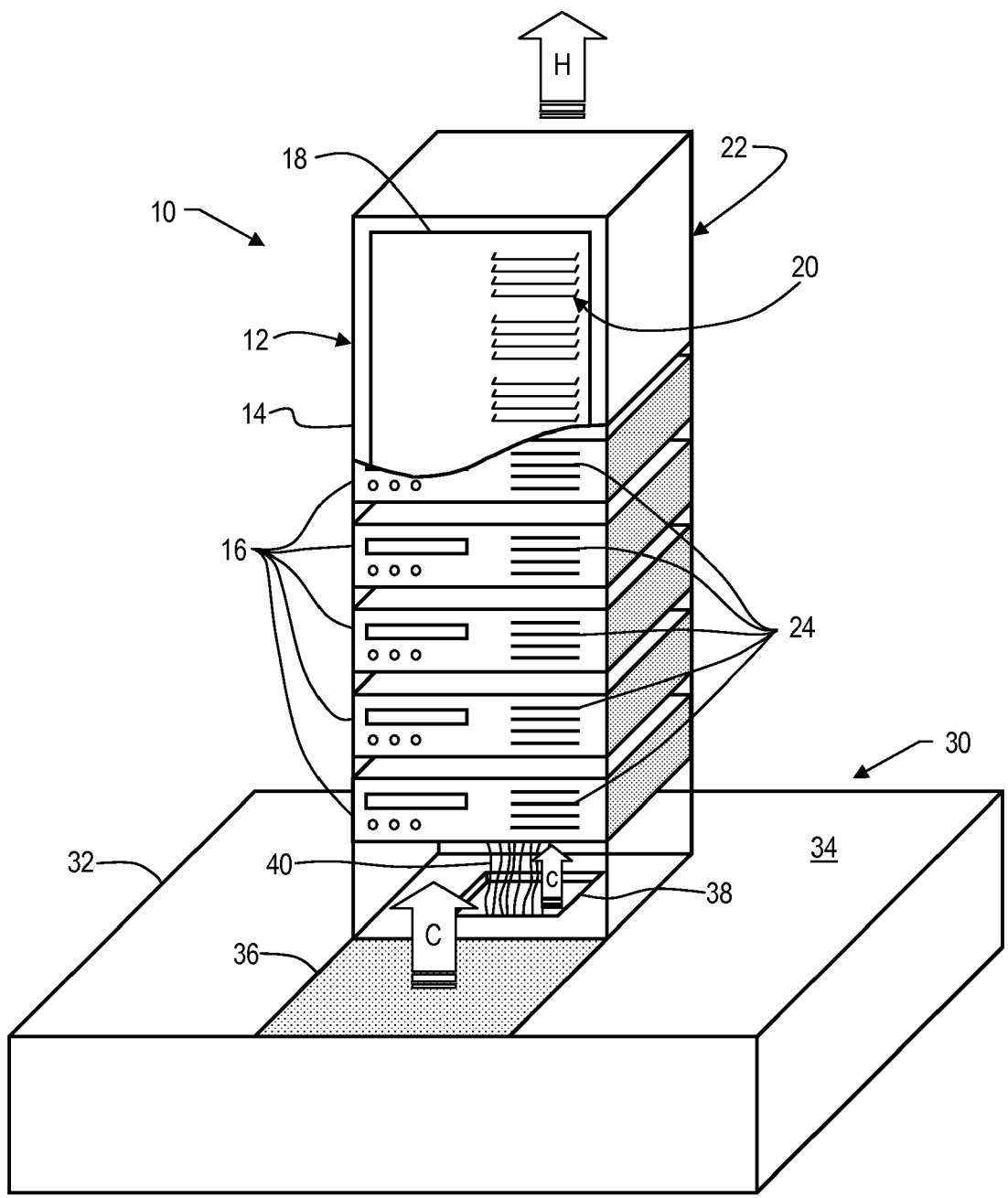
FIG. 3 is a perspective view of an air conditioning system utilizing an exemplary cabinet configuration.

Stacks of computer components are typically housed within electronic component cabinets, an example of which is depicted in FIG. 3. FIG. 3 depicts a data center facility 10 that includes an exemplary electronic component cabinet 12 having a frame 14 with a plurality of electronic components 16, such as computer processors, mounted therein. The cabinet 12 has a front panel or door 18 that allows access to the electronic components 16.

In order to allow for the cooling of the electronic components within the cabinet 12, the front panel 18 has air intakes 20 and the rear 22 of the cabinet has air outlets (not shown). The air intakes 20 correspond to cooling intakes 24 on the front of the electronic components 16, and the outlets on the rear 22 of the cabinet 12 correspond to outlets (not shown) on the rear of the electronic components 16. The electronic components 16 typically include a cooling fan (not shown) within the housing thereof that forces cooling air into the component housing through the cooling intakes 24 on the front of the electronic components 16 and out through the outlets on the rear of the electronic components 16, in order to remove heat from the housing of the components.

Therefore, in order to cool one or more cabinets 12 provided within a room of a data center facility, a raised-floor plenum type air conditioning system 30 can be provided. The system 30 is fed by a heating, ventilating, and air-conditioning (HVAC) system that, during cooling, pumps cooling air into an interior of an under-floor plenum 32. The frame 14 of the cabinet 12 is mounted to an upper surface 34 of the plenum 32, and the plenum has an air conditioning outlet (e.g., a perforated floor tile) 36 that is provided adjacent the front side of the cabinet 12. Additionally, the plenum 32 has a hole (or cable egress) 38 through which all of the electrical wiring 40 for the electronic components 16 in the cabinet 12 extend.

The raised-floor plenum type air conditioning system 30 is intended to cool the components 16 within the cabinet 12 by forcing cooling air, C, up through the air conditioning outlet 36, which will then be sucked in through the air intakes 20 and in through the cooling intakes 24 by the cooling fans in the components 16, and then the heated exhaust air will be discharged out the rear 22 of the cabinet and the heated air, H, will rise and be discharged from the room and/or circulated back through the air conditioning system. However, in the configuration in FIG. 3, the hole 38 allows cold air, C, to exit the plenum 32 and enter the cabinet at a disadvantageous location, which has been determined to significantly reduce the overall efficiency of the air conditioning system.

Turning to FIG. 1, in order to cool one or more cabinets 12 provided within a room of a data center facility, a raised-floor plenum type air conditioning system 51 is provided. The system 51 is fed by a heating, ventilating, and air-conditioning (HVAC) system that, during cooling, pumps cooling air into an interior of an under-floor plenum 52. The frame 14 of the cabinet 12 is mounted to an upper surface 54 of the plenum 52, and the plenum has an air conditioning outlet (e.g., a perforated floor tile) 56 that is provided adjacent the front side of the cabinet 12. Additionally, the plenum 52 has a hole (or cable egress) 58 through which all of the electrical wiring 40 for the electronic components 16 in the cabinet 12 extend.

FIG. 1 also depicts a perspective view of a cover assembly 60 for the cable egress opening 58 of the air conditioning system for the data center 50, according to an exemplary embodiment. The cover assembly 60 advantageously seals the cable egress opening 58 to prevent or substantially reduce the passage of cooling air through the opening 58, while allowing the electrical wiring 40 to remain extending therethrough. The raised-floor plenum type air conditioning system 51 is intended to efficiently cool the components 16 within the cabinet 12 by forcing cooling air, C, up through the air conditioning outlet 56, which will then be sucked in through the air intakes 20 and in through the cooling intakes 24 by the cooling fans in the components 16, and then the heated exhaust air will be discharged out the rear 22 of the cabinet and the heated air, H, will rise and be discharged from the room and/or circulated back through the air conditioning system. The cover assembly 60 prevents or substantially reduces cooling air from exiting the plenum 52 through the hole 58, thereby significantly increasing the overall efficiency of the air conditioning system.

When configuring facilities for housing computer data centers, there are two issues of great concern; namely, ensuring that there is sufficient air conditioning to maintain the computing equipment in proper operating conditions, and ensuring that there is sufficient power to operate both the computing equipment and the air conditioning system. Data center managers are faced with the need to provide infrastructure capable to support growth of the data center not only with regard to power consumption issues, but also HVAC issues in order to maintain the equipment at proper operating conditions.

The cover assembly allows for the more efficient utilization of HVAC components in a data center infrastructure. An estimated fifty to eighty percent of conditioned air is lost due to insufficient sealing of the cable egress openings in a raised floor computer center. The cover assembly is effective in maintaining static air pressure in under-floor plenums without the need for modifications to equipment cabinets or floor tiles. Thus, the cover assembly allows for the increase in cooling efficiency of computer room air conditioners, with an associated reduction in power utilization.

The cover assembly increases the efficiency of computer room air conditions in data centers by increasing the static air pressure in under-floor plenums, thereby resulting in a decrease in the necessary output load on the HVAC system. The cover assembly prevents cooling air from escaping in areas where it is unused or inefficiently used, and forces the cooling air to the front of the cabinets where the computer component air intakes are located. Furthermore, the cover assembly advantageously allows for the installation thereof to provide a seal to the cable egress without the need for any modifications to the existing floor or equipment.

By sealing all cable egress points in a typical data center using the cover assembly, the static air pressure within the under floor air conditioning plenum can be significantly increased, thus allowing for a reduction in air handler usage (e.g., a data center previously utilizing four forty-ton air handlers can be rendered efficient enough to shut down one of the forty-ton air handlers, and merely operate with the remaining three air handlers under normal conditions). The use of such cover assemblies not only reduce the load on the HVAC system, but also reduce energy usage.

FIGS. 2A-2F depict an embodiment of an apparatus or cover assembly 60 in various stages of assembly. The cover assembly 60 includes base members 62 and 64 that are configured to be adjustably attached together. The base member 62 has a U-shaped portion 66 that includes a projecting arm 68 that is hollow and has an open end 69, and a projecting arm 70 that is hollow and has an open end 71. The cover assembly 60 also includes a base locking device that includes a pawl member 72 that works in conjunction with ratchet teeth on the base member 64, as will be discussed in detail below.

The base member 62 further includes a lower flange 74 extending from the U-shaped portion 66, and an upper flange 76 that is also extending from the U-shaped portion 66. The direction that the lower flange 74 and upper flange 76 extend and the spacing of these flanges are generally configured to receive an edge of the hole 58 of the plenum 52. The upper flange 76 includes a slot member 78 extending along an edge of an upper surface of the upper flange 76 to define a slot 79 that can slidably receive a cover member, as will be discussed in greater detail below. The upper flange 76 also includes a slot member 80 extending along an edge of the upper surface of the upper flange 76 to define a slot 81 that can slidably receive the opposite edge of the cover member. The cover assembly 60 also includes a cover locking device that includes ratchet teeth 82 that work in conjunction with a ratchet pawl on the cover member, as will be discussed in detail below.

The base member 64 has a U-shaped portion 84 that includes a projecting arm 86 that has an end 87, and a projecting arm 88 that has an end 89. The base locking device of the cover assembly 60 further includes ratchet teeth 90 that work in conjunction with the pawl member 72 on the base member 62. It is noted that a pawl member can also be provided on projecting arm 68 and ratchet teeth may ratchet can also be provided on projecting arm 86 if desired.

The base member 64 further includes a lower flange 92 extending from the U-shaped portion 84, and an upper flange 94 that is also extending from the U-shaped portion 84. The direction that the lower flange 92 and upper flange 94 extend and the spacing of these flanges are generally configured to receive an edge of the hole 58 of the plenum 52. The upper flange 94 includes a slot member 96 extending along an edge of an upper surface of the upper flange 94 to define a slot 97 that can slidably receive a cover member. The upper flange 94 also includes a slot member 100 extending along an edge of the upper surface of the upper flange 94 to define a slot 101 that can slidably receive the opposite edge of the cover member. The cover assembly 60 also includes a cover locking device that includes ratchet teeth 98 that work in conjunction with a ratchet pawl on the cover member.

Figure 2A:
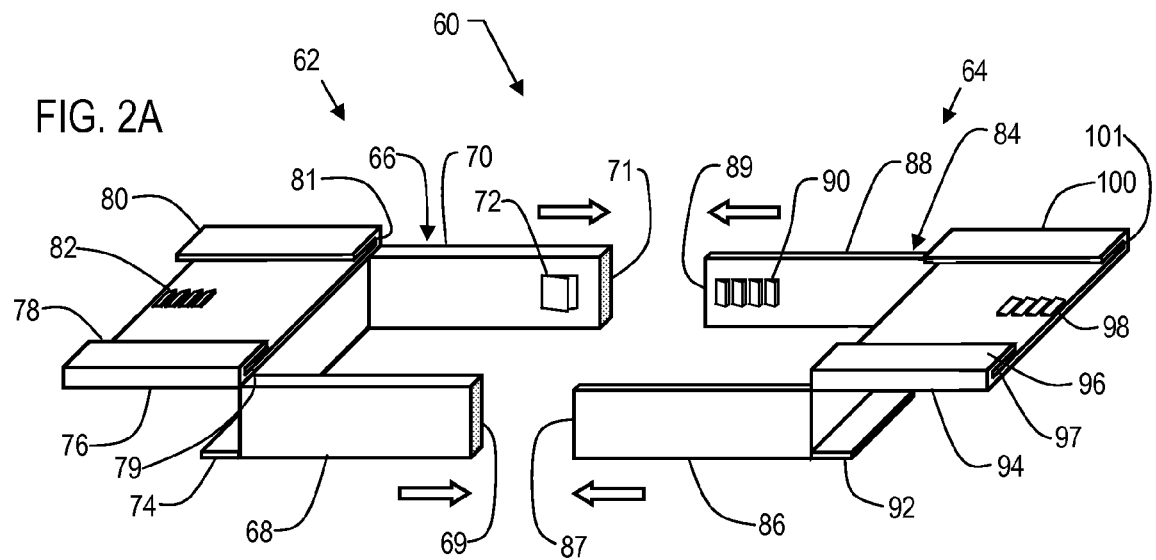
FIG. 2A is a perspective view of two base members of a cover assembly being joined together, according to an exemplary embodiment.
Figure 2B:
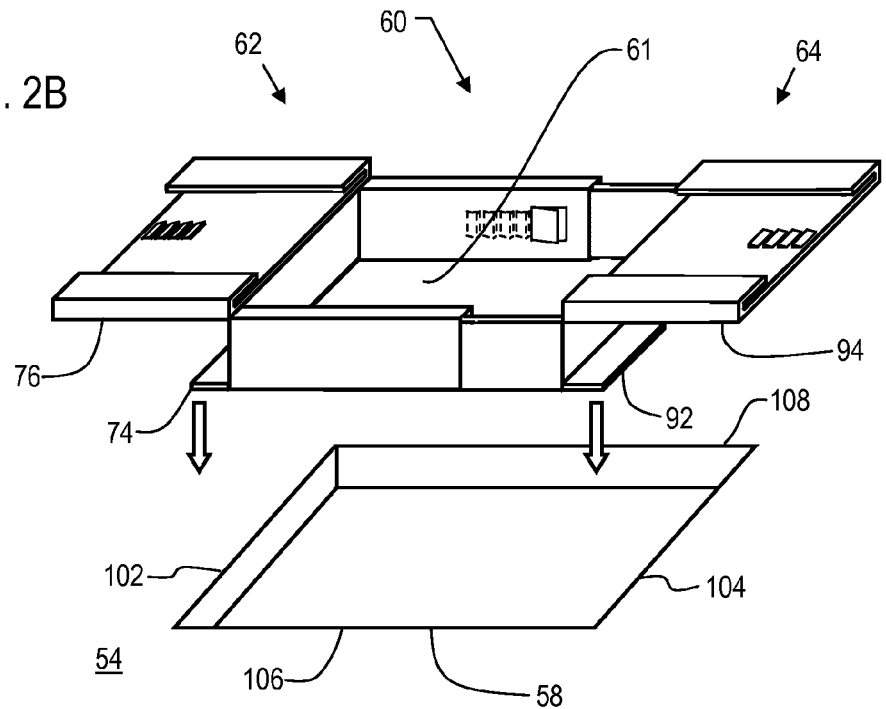
FIG. 2B is a perspective view of the joined base members of the cover assembly being lowered into the cable egress opening.

In order to install the cover assembly within the hole or cable egress 58 of the plenum 52, the base members 62 and 64 are slidably joined together to define an opening 61. Thus, ends 87 and 89 can be inserted into open ends 69 and 71, respectively, and the projecting arms 86 and 88 can be slidably received within projecting arms 68 and 70, respectively, as shown in FIGS. 2A through 2B. The base members 62 and 64 are slid towards one another until the lower flanges 74 and 92 are close enough to fit through the hole 58, as shown in FIG. 2B. During this joining together of the base member 62 and 64, the pawl member 72 will need to be disengaged from the ratchet teeth 90, so that the base members 62 and 64 can be slid towards one another.

Figure 2C:
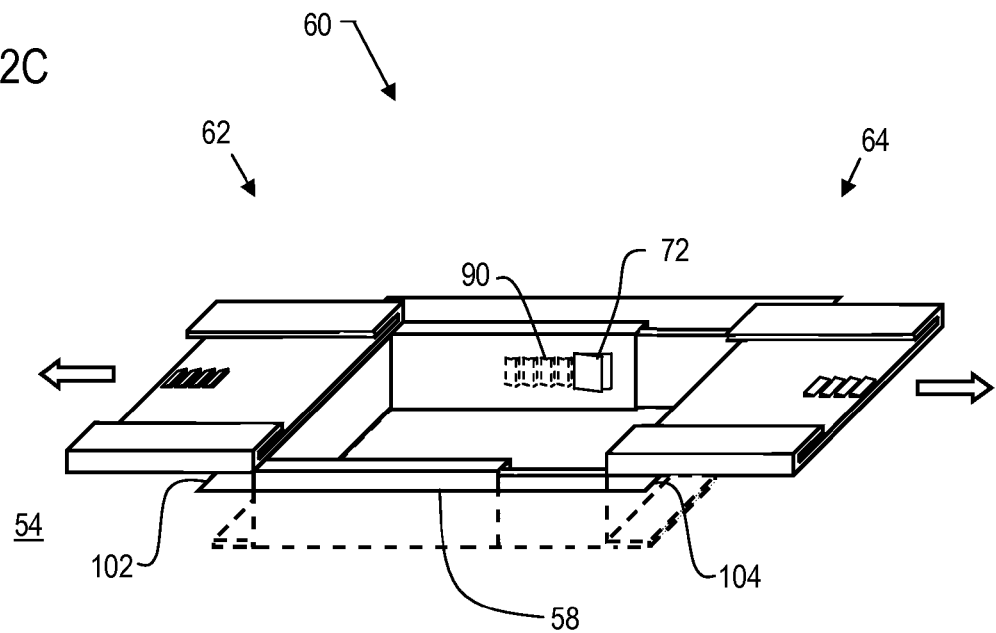
FIG. 2C is a perspective view of the base members of the cover assembly being spread apart within the cable egress opening.

Accordingly, once the base members 62 and 64 are slid towards one another such that the lower flanges 74 and 92 are close enough to fit through the hole 58, as is shown in FIG. 2B, such that the lower flanges 74 and 92 fit in between opposite edges 102 and 104 of the hole 58. Then, the joined base members 62 and 64 are lowered within the hole 58, as shown in FIGS. 2B through 2C. The upper flanges 96 and 94 will come to rest upon the upper surface 54 of the plenum 52. It is noted that the base members 62 and 64 should be configured such that they can fit through the hole 58 in between opposing edges 106 and 108 thereof.

Figure 2D:
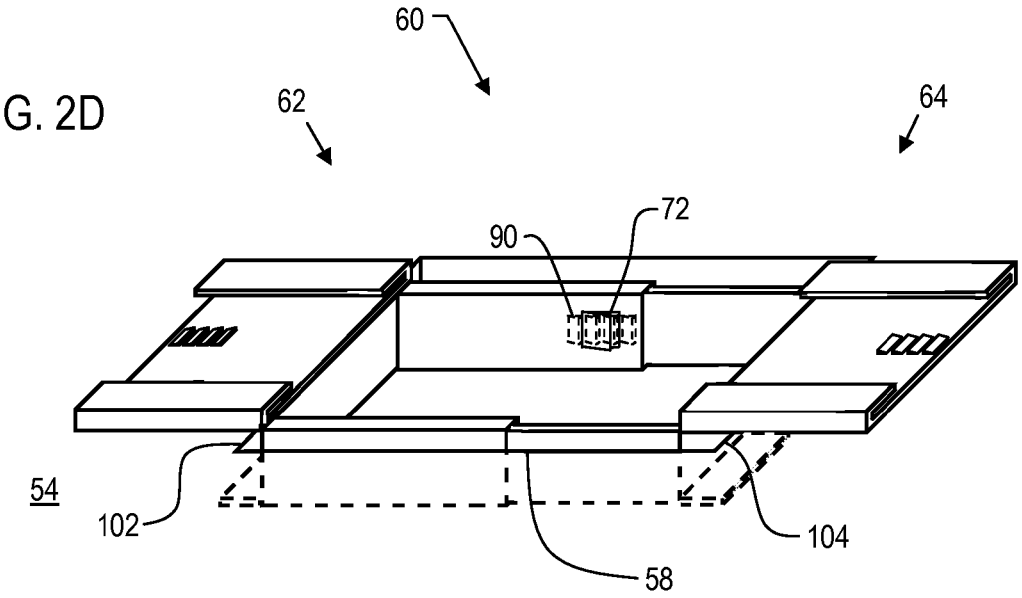
FIG. 2D is a perspective view of the base members of the cover assembly spread apart in a locked position within the cable egress opening.

Once the base members 62 and 64 are lowered within the hole 58, then the base members 62 and 64 will be slid away from one another, as shown in FIGS. 2C through 2D. Thus, the base members 62 and 64 will be slid away from one another until the U-shaped portions 66 and 84 are adjacent or in contact with the edges 102 and 104, respectively, of the hole 58. In this position, as shown in FIG. 2D, the upper and lower flanges of the base member 62 receive the edge 102, and the upper and lower flanges of the base member 64 receive the edge 104. Furthermore, in this position, the pawl member 72 engage with the ratchet teeth 90 to form the base locking device, which then prevents the base members 62 and 64 from sliding towards one another, unless the pawl member 72 is disengaged from the ratchet teeth 90 by a user. It is noted that the pawl member 72 and ratchet teeth 90 allow the base members 62 and 64 to be slid away from one another, but prevent the base members 62 and 64 from being slid toward one another in the absence of a user disengaging the pawl member 72 from the ratchet teeth 90. Thus, in the position shown in FIG. 2D, the base members 62 and 64 of the cover assembly will be locked into position within the hole 58.

It should be noted that the embodiment depicted herein is merely exemplary, and that, for example, alternative configurations of the projecting arms and the base locking device can be provided. For example, projecting arm 68 of the base member 62 could instead be provided with the configuration of projecting arm 88 having end 89 and ratchet teeth 90, and projecting arm 86 of the base member 64 could instead be provided with the configuration of projecting arm 70 having open end 71 and ratchet teeth pawl member 72. Such a configuration would provided base member 62 and base member 64 with the same configurations, thereby allowing for the manufacture and usage of only one configuration of base member that can interconnect with another base member of the same configuration.

Figure 2E:
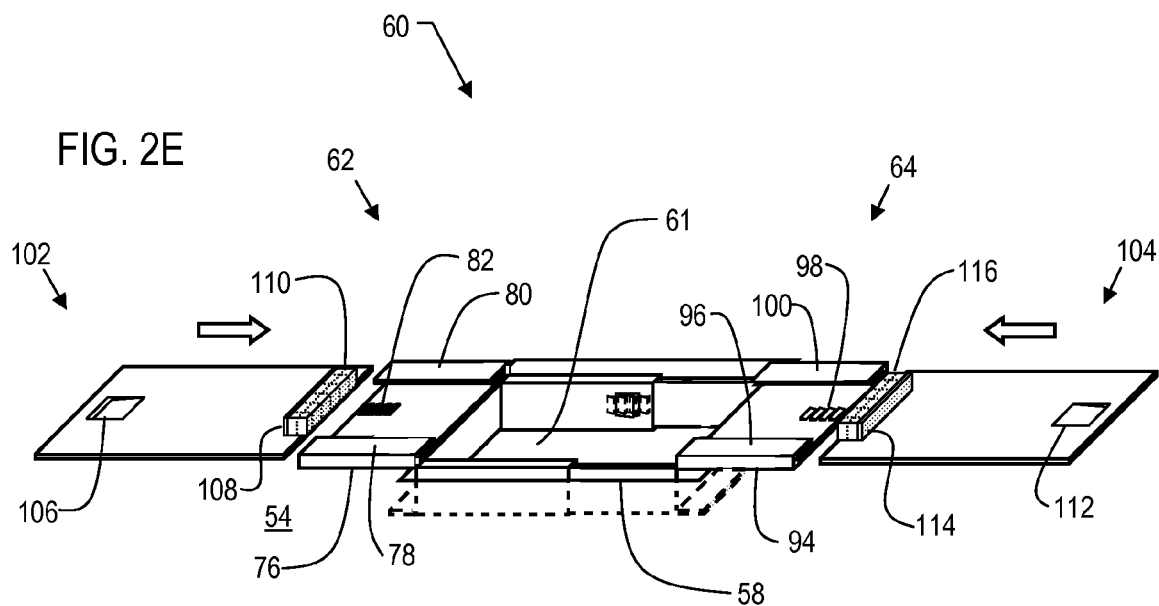
FIG. 2E is a perspective view of two covers of the cover assembly being slid onto the base members.
Figure 2F:
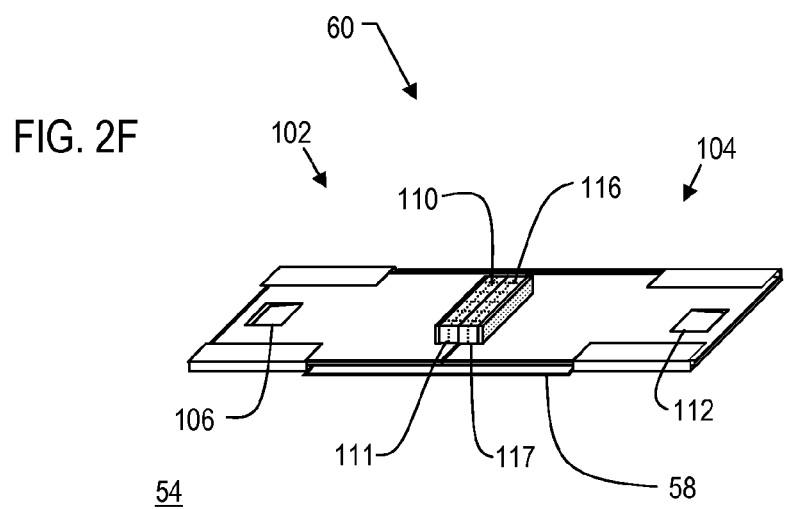
FIG. 2F is a perspective view of the covers of the cover assembly in locked positions over the cable egress opening.

Once the base members 62 and 64 are in the locked position within the hole 58 as shown in FIG. 2D, then a cover can be attached to the base members 62 and 64 in order to cover/seal the opening 61 and complete the cover assembly 60. As shown in FIGS. 2E and 2F, a first cover member 102 is attached to the base member 62, and a second cover member 104 is attached to the base member 64. The first cover member 102 is slidably received within slot 79 defined by slot member 78 and the upper surface of the upper flange 76, and within slot 81 defined by slot member 80 and the upper surface of the upper flange 76. The second cover member 104 is slidably received within slot 97 defined by slot member 96 and the upper surface of the upper flange 94, and within slot 101 defined by slot member 100 and the upper surface of the upper flange 94.

The first cover member 102 includes a pawl member 106, which operates in conjunction with ratchet teeth 82 to form a cover locking device for the cover assembly 60. Thus, when the first cover member is attached to the base member 62 by sliding from left to right, as shown in FIG. 2E through 2F, the pawl member 106 and ratchet teeth 82 allow such movement, but prevent the first cover member 102 from sliding from right to left in the absence of a user disengaging the pawl member 106 from the ratchet teeth 82. Thus, in the position shown in FIG. 2F, the first cover member 102 of the cover assembly will be prevented from sliding leftward and thus will be locked into position against the second cover member 104.

The first cover member 102 includes a leading edge that has an upwardly bent flange 108. An insulating member 110 is provided on a surface of the flange 108. The insulating member preferably includes one or more insulating portions that are configured to be removable from the first cover member 102 to expose one or more apertures through the cover. For example, the insulating member 110 can be include a matrix of rows and columns of removable insulations cubes (sometimes referred to a "pick and pluck foam" where the demarcation between cubes are perforated to allow for the easy removal of a cube). The upwardly bent flange 108 notably leaves an aperture 111 through the first cover member 102, and thus, by selectively removing one or more of the insulation cubes, one or more apertures can be exposed through the first cover member in order to allow features, such as electrical wiring 40, to extend therethrough with relatively minimal effect to the sealing properties of the cover.

The second cover member 104 includes a pawl member 112, which operates in conjunction with ratchet teeth 98 to form the cover locking device for the cover assembly 60. Thus, when the second cover member is attached to the base member 64 by sliding from right to left, as shown in FIG. 2E through 2F, the pawl member 112 and ratchet teeth 98 allow such movement, but prevent the second cover member 104 from sliding from left to right in the absence of a user disengaging the pawl member 112 from the ratchet teeth 98. Thus, in the position shown in FIG. 2F, the second cover member 104 of the cover assembly will be prevented from sliding rightward and thus will be locked into position against the first cover member 102.

The second cover member 104 includes a leading edge that has an upwardly bent flange 114. An insulating member 116 is provided on a surface of the flange 114. The insulating member preferably includes one or more insulating portions (such as the pick and pluck foam blocks described above) that are configured to be removable from the second cover member 104 to expose one or more apertures through the cover. The upwardly bent flange 114 notably leaves an aperture 117 through the second cover member 104, and thus, by selectively removing one or more of the insulation cubes, one or more apertures can be exposed through the second cover member in order to allow features, such as electrical wiring 40, to extend therethrough with relatively minimal effect to the sealing properties of the cover.

Alternatively, one of the cover members need not include the upwardly bent flange and insulating member, if so desired. Also, the cover could be configured as a single cover member if so desired, with the provision of an aperture for any electrical wiring on an edge thereof, for example.

As shown in FIG. 1, the cover assembly 60 can be used to seal the cable egress or hole 58 of an air conditioning plenum 52, in order to direct the cooling air to exit through the air conditioning outlet 56, rather than through the hole 58. Thus, in a data center where an electronic component cabinet 12 is provided on an upper surface 54 of the air conditioning plenum 52, the cooling air exits the outlet 56 adjacent to the front side of the cabinet 12 such that the cooling air efficiently reaches the air intakes 20 and thus is provided to the electronic components 16 for cooling.

In the exemplary embodiment shown in the figures, the cover assembly 60 generally includes four components (i.e., base members 62 and 64, and cover members 102 and 104) that can be installed without the need to drill or otherwise modify the existing plenum or cabinets. The base members 62 and 64, which form trim pieces, are coupled together, then the assembly is dropped into the hole 58, and then the base members 62 and 64 are pulled apart, thereby securing the assembly to the floor tile. Once the base members 62 and 64 are installed, then two cover members 102 and 104 are slid into slots or rails located on the molding of the trim pieces. These cover members 102 and 104 block air passing through the hole 58. At ends of the cover members 102 and 104 are two rows of pick and pluck foam, which can be removed from areas where cables require passage. The resulting structure prevents air from the air conditioning plenum from escaping through the cable egress 58 by sealing this egress. As a result, the static pressure in the air conditioning plenum is increased, thereby reducing the load on the HVAC system, and the inefficient mixing of cold and hot air that can occur within the lower end of the cabinet 12 through the hole 58 will be prevented, thereby more efficiently utilizing the HVAC equipment.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. An apparatus comprising:
    a first base member having an upper flange and a lower flange;
    a second base member having an upper flange and a lower flange, said second based member being configured to be adjustably attached to said first base member to define an opening; and
    a cover configured to be attached to said first base member and/or said second base member to cover said opening,
    wherein said upper flange and said lower flange of said first base member are configured to receive a first edge of a hole of an air conditioner plenum and said upper flange and said lower flange of said second base member are configured to receive a second edge of the hole of the air conditioner plenum.

2. The apparatus of claim 1, wherein said upper flange of said first base member includes slots, wherein said upper flange of said second base member includes slots, and wherein said slots of said of said upper flange of said first base member and said slots of said upper flange of said second base member are configured to slidably receive said cover.

3. The apparatus of claim 1, wherein said cover includes a first cover configured to be attached to said first base member and a second cover configured to be attached to said second base member.

4. The apparatus of claim 3, further comprising a cover locking device configured to lock said first cover and said second cover against one another over said opening.

5. The apparatus of claim 4, wherein said cover locking device includes a pawl member either on said first cover and said second cover or on said upper flange of said first base member and said upper flange of said second base member, and wherein said cover locking device further includes ratchet teeth on the other of said upper flange of said first base member and said upper flange of said second base member or on said first cover and said second cover.

6. The apparatus of claim 1, wherein said cover includes one or more insulating portions configured to be removable from said cover to expose one or more apertures through said cover.

7. The apparatus of claim 1, further comprising a base locking device configured to lock said first base member and said second base member within the hole of the air conditioner plenum.

8. The apparatus of claim 7, wherein said first base member includes first projecting arms that are hollow, wherein said second base member includes second projecting arms that are configured to be received within said first projecting arms, and wherein said base locking device includes a pawl member on either said first projecting arms or said second projecting arms and ratchet teeth on the other of said second projecting arms or said first projecting arms.

9. A system comprising:
    an air conditioning plenum having an upper surface with an air conditioning outlet and a hole;
    an electronic component cabinet attached to said upper surface of said air conditioning plenum, said electronic component cabinet having one or more air intakes on a first side thereof and one or more air outlets on a second side thereof, wherein said hole fluidly connects to an interior of said electronic component cabinet, and wherein said air conditioning outlet is provided at a location adjacent said first side of said electronic component cabinet; and
    an apparatus including:
        a first base member having an upper flange and a lower flange;
        a second base member having an upper flange and a lower flange, said second based member being configured to be adjustably attached to said first base member to define an opening; and
        a cover configured to be attached to said first base member and/or said second base member to cover said opening,
    wherein said upper flange and said lower flange of said first base member are configured to receive a first edge of said hole of said air conditioner plenum and said upper flange and said lower flange of said second base member are configured to receive a second edge of said hole of said air conditioner plenum.

10. The system of claim 9, wherein said upper flange of said first base member includes slots, wherein said upper flange of said second base member includes slots, and wherein said slots of said of said upper flange of said first base member and said slots of said upper flange of said second base member are configured to slidably receive said cover.

11. The system of claim 9, wherein said cover includes a first cover configured to be attached to said first base member and a second cover configured to be attached to said second base member, wherein said apparatus further comprises a cover locking device configured to lock said first cover and said second cover against one another over said opening.

12. The system of claim 11, wherein said cover locking device includes a pawl member either on said first cover and said second cover or on said upper flange of said first base member and said upper flange of said second base member, and wherein said cover locking device further includes ratchet teeth on the other of said upper flange of said first base member and said upper flange of said second base member or on said first cover and said second cover.

13. The system of claim 9, wherein said cover includes one or more insulating portions configured to be removable from said cover to expose one or more apertures through said cover.

14. The system of claim 9, wherein said apparatus further comprises a base locking device configured to lock said first base member and said second base member within the hole of the air conditioner plenum, wherein said first base member includes first projecting arms that are hollow, and wherein said second base member includes second projecting arms that are configured to be received within said first projecting arms.

15. The system of claim 14, wherein said base locking device includes a pawl member on either said first projecting arms or said second projecting arms and ratchet teeth on the other of said second projecting arms or said first projecting arms.

16. A method comprising:
providing an air conditioning plenum having an upper surface with an air conditioning outlet and a hole;
providing an electronic component cabinet on the upper surface of the air conditioning plenum, the electronic component cabinet having one or more air intakes on a first side thereof and one or more air outlets on a second side thereof, wherein the hole fluidly connects to an interior of the electronic component cabinet, and wherein the air conditioning outlet is provided at a location adjacent the first side of the electronic component cabinet; and
covering the hole by providing an apparatus within the hole, wherein the apparatus includes:
a first base member having an upper flange and a lower flange,
a second base member having an upper flange and a lower flange, the second based member being adjustably attached to the first base member to define an opening, and
a cover attached to the first base member and/or the second base member to cover the opening,
wherein the covering of the hole includes providing the apparatus within the hole such that the upper flange and the lower flange of the first base member receive a first edge of the hole of the air conditioner plenum and the upper flange and the lower flange of the second base member receive a second edge of the hole of the air conditioner plenum.

17. The method of claim 16, wherein the first base member includes first projecting arms that are hollow and the second base member includes second projecting arms that are configured to be received within the first projecting arms, and wherein the apparatus is provided within the hole by slidably connecting the second projecting arms within the first projecting arms, sliding the first base member and the second base member together until the lower flange of the first base member and the lower flange of the second base member fit within the hole, lowering the apparatus within the hole to a position where the lower flanges of the first and second base members are beneath the hole and the upper flanges of the first and second base members are above the hole, and then sliding the first base member and the second base member away from one another until the first edge is received within the upper flange and the lower flange of the first base member and the second edge is received within the upper flange and the lower flange of the second base member.

18. The method of claim 17, wherein the apparatus includes a base locking device configured to lock relative positions of the first base member and the second base member within the hole of the air conditioner plenum when the first edge is received within the upper flange and the lower flange of the first base member and the second edge is received within the upper flange and the lower flange of the second base member.

19. The method of claim 16, wherein the upper flange of the first base member includes slots and the upper flange of the second base member includes slots, and wherein the covering of the hole includes sliding the cover in the slots of the upper flange of the first base member and the slots of the upper flange of the second base member.

20. The method of claim 19, wherein the cover includes a first cover and a second cover, wherein the covering of the hole includes sliding the first cover in the slots of the of the upper flange of the first base member and sliding the second cover in the slots of the upper flange of the second base member, and wherein the apparatus includes a cover locking device configured to lock the first cover and the second cover against one another over the opening.

21. The method of claim 16, wherein the cover includes one or more insulating portions configured to be removable from the cover to expose one or more apertures through the cover.

* * * * *